(12) United States Patent
Lee

(10) Patent No.: US 6,169,017 B1
(45) Date of Patent: Jan. 2, 2001

(54) METHOD TO INCREASE CONTACT AREA

(75) Inventor: Tong-Hsin Lee, Taipei Hsien (TW)

(73) Assignees: United Silicon Incorporated; United Microelectronics Corp., both of Hsinchu (TW)

(*) Notice: Under 35 U.S.C. 154(b), the term of this patent shall be extended for 0 days.

(21) Appl. No.: 09/447,858

(22) Filed: Nov. 23, 1999

(51) Int. Cl.⁷ .................. H01L 21/3205; H01L 21/4763
(52) U.S. Cl. ............................. 438/585; 257/522
(58) Field of Search .................................. 438/585, 595, 438/666, 411, 421, 422, 456, 299, 301, 303, 304; 257/522, 499, 566

(56) References Cited

U.S. PATENT DOCUMENTS

| | | | |
|---|---|---|---|
| 5,869,379 | * | 2/1999 | Gardner et al. ............... 438/305 |
| 6,015,746 | * | 1/2000 | Yeh et al. ..................... 438/421 |
| 6,104,077 | * | 8/2000 | Gardner et al. ............... 257/522 |

* cited by examiner

*Primary Examiner*—Richard Elms
*Assistant Examiner*—Christian D. Wilson
(74) *Attorney, Agent, or Firm*—J.C. Patents; Jiawei Huang

(57) ABSTRACT

A fabrication method to increase the gate contact area is described, in which a conformal first sacrificial layer is formed on the silicon substrate and the gate structure. A second sacrificial layer is further formed on the silicon substrate, wherein the surface of the second sacrificial layer is lower than the top of the polysilicon gate by a certain thickness. The exposed sacrificial layer is then removed, followed by forming a conformal silicon layer to cover the silicon substrate. A spacer is further formed on a sidewall of the gate structure. Using the spacer as a mask, the exposed polysilicon layer is removed to form a side-wing polysilicon layer on both sides of the gate to increase the contact area of the gate. The spacer, the second sacrificial layer and the first sacrificial layer are then removed. A silicidation process is further conducted to form a silicide layer on the gate structure and the two side-wing polysilicon layer to lower the gate contact resistance.

30 Claims, 3 Drawing Sheets

METHOD TO INCREASE CONTACT AREA

BACKGROUND OF THE INVENTION

1. Field of the Invention

The present invention relates to a fabrication method for a semiconductor device. More particularly, the present invention relates to a fabrication method for a metal-oxide-semiconductor (MOS) with an increased gate contact area.

2. Description of the Related Art

In deep sub-micron integrated circuit technology, the line width, the contact area and the contact depth are continuously being reduced. To effectively raise the quality of a device, to decrease the resistance and to reduce the RC delay time due to a high resistance and capacitance, the fabrication of the MOS transistor tends to employ a silicide layer to reduce the contact resistance at the gate and the source/drain region. Since the fabrication of a silicide layer does not require the photolithography process, it is thus known as the self-aligned silicide process. A commonly known silicide includes titanium silicide ($TiSi_x$). Since titanium silicide has a low resistance and is more easily controlled during the fabrication process, titanium silicide becomes popular in the fabrication of a semiconductor device.

The conventional self-aligned silicide fabrication process includes providing a semiconductor substrate having a shallow trench structure. A polysilicon gate is formed on the substrate, wherein the gate comprises a spacer. A source/drain region is also formed in the substrate on both sides of the gate.

Thereafter, a layer of titanium is deposited on the semiconductor substrate, covering the gate and the surface of the source/drain region. A two staged rapid thermal process (RTP) is conducted for titanium to react with the silicon on the surface of the source/drain region and the gate to form a titanium silicide layer on the surface of the gate and the source/drain region. The unreacted titanium layer is then removed by wet etching to complete the self-aligned silicide manufacturing process.

The titanium silicide comprises the high resistance metastable C49 phase titanium silicide ($C49-TiSi_2$) and the low resistance, thermodynamically stable C54 phase titanium silicide ($C54-TiSi_2$). The first stage of the rapid thermal process results in the titanium silicide layer ($TiSi_2$) comprising a major component of the C49 phase and a minor component of the C54 phase. Thereafter, the unreacted titanium is removed. In the second stage of the rapid thermal process, the temperature is further increased to rapidly anneal in-situ, transforming the titanium silicide layer from the high resistance C49 phase titanium silicide to the low resistance C54 phase titanium silicide.

The resistance of the C49 phase titanium silicide is higher and its formation temperature is lower. On the other hand, the resistance of the C54 titanium silicide is lower and its formation temperature is higher. In general, the titanium silicide is transformed from the high resistance C49 phase to the low resistance C54 phase via a rapid thermal process. In order for the metal layer and silicon to react to form a silicide layer with a substantial thickness and a more uniform quality, it is necessary to increase the temperature and the duration for the thermal process Along with the size reduction of the polysilicon gate, the formation temperature for the C54 phase titanium silicide is increased due to the narrow line effect. The narrow line effect refers to the relationship between the linewidth and the phase transformation temperature. As the linewidth decreases, the phase transformation temperature for the titanium silicide to transform from the high resistance C49 phase to the low resistance C54 phase increases. As the temperature for the RTP process is increased to form the C54 titanium silicide, the quality of the titanium silicide becomes unstable and is not suitable for use in a small-dimension device. In addition, the higher reaction temperature is difficult to control, and lateral growth of silicon from the source/drain region to the spacer is likely to occur. As a result, as the device integration increases and the device dimension decreases, bridging is likely to occur on the side of the gate. To avoid the occurrence of bridging, the reaction temperature cannot be raised. Consequently, a higher resistance results at the polysilicon gate due to the narrow line effect and the difficulty of phase transformation.

SUMMARY OF THE INVENTION

Based on the foregoing, the present invention provides a method to increase the gate contact area, wherein a side-wing layer is formed on both sides of the gate to increase the area for a silicide formation and to lower the gate contact resistance. The narrow line effect is thus prevented. An air spacer is further formed under the side-wing layer to reduce the parasitic capacitance between the gate and the source/drain region The current invention provides a fabrication method for a semiconductor device in which the gate contact area is increased. The method is applicable on a substrate comprising isolation structures. The method includes forming a gate structure on the silicon substrate. A conformal sacrificial layer is formed on the silicon substrate and on the gate structure. A light doping is conducted to form a lightly doped source/drain region at both sides of the gate in the silicon substrate. A first spacer is then formed on the sidewall of the gate structure. A heavy doping is further performed on both sides of the gate structure in the substrate, using the spacer as mask, to form the heavily doped source/drain region. Thereafter, a second sacrificial layer is formed covering the silicon substrate, followed by partially removing the second sacrificial layer, the first spacer and the first sacrificial layer until the surface of the second sacrificial layer is lower than the top of the gate by a certain thickness. A conformal polysilicon layer is then formed, covering the silicon substrate. After this, a second spacer is formed on the sidewall of the gate on the conformal polysilicon layer. The portion of the polysilicon layer that is not covered by the second spacer is removed to from a sidewing polysilicon layer at both sides of the gate. The second spacer, the second sacrificial layer, the first spacer and the first sacrificial layer are removed. Subsequently, a metal salicidation process is conducted on the gate, the side-wing polysilicon layer and the surface of the source/drain region to form a silicide layer. An insulation layer is then formed on the silicon substrate covering the side-wing polysilicon layer. An air spacer is thus formed under the polysilicon side-wing layer.

The present invention provides a fabrication method for a semiconductor device, in which a side-wing layer is formed on both sides of the gate to increase the gate area for silicidation and to avoid the narrow line effect. In addition, an air spacer is formed under the side-wing layer to reduce the parasitic capacitance between the gate and the source/drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The present invention provides a fabrication method to increase the gate contact area. The present invention also provides a fabrication method for a MOS device in which the method to increase the gate contact is incorporated. In the preferred embodiment, the fabrication of a MOS device is disclosed to illustrate in detail the fabrication method for increasing the gate contact area according to the present invention.

Figure 1A:
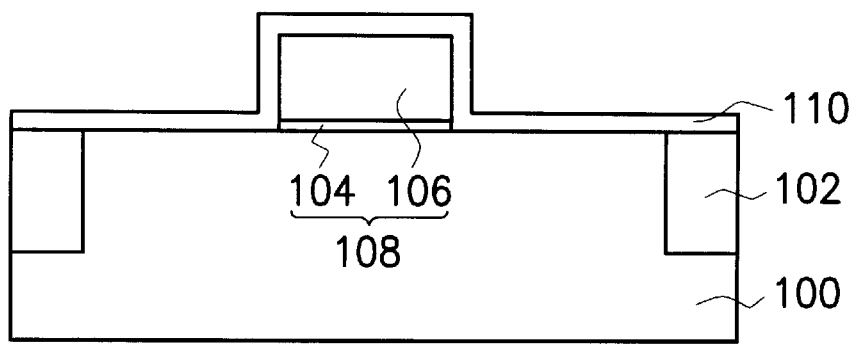
FIGS. 1A to 1I are schematic, cross-sectional views showing the manufacturing of a metal-oxide-semiconductor device according to the preferred embodiment of the present invention.

Referring to FIG. 1A, a silicon substrate 100 comprising isolation structures 102, for example, shallow trench isolation structures, is provided. A gate 108, comprising a gate oxide layer 104 and a polysilicon layer 106, is formed on the substrate 100, wherein the gate structure 108 is about 3000 Å high. The technique for forming the gate 108 is familiar to persons skilled in the art and will not be re-iterated in the preferred embodiment of the present invention.

A conformal sacrificial layer 110 is formed on the silicon substrate 100 and covering the gate structure 108. The sacrificial layer 110, such as silicon nitride, is formed by, for example, low pressure chemical vapor deposition, to a thickness of about 200 angstroms. The sacrificial layer 110 on the isolation structures 102 protects the device isolation structures 102 from being damaged during the subsequent etching process.

Figure 1B:
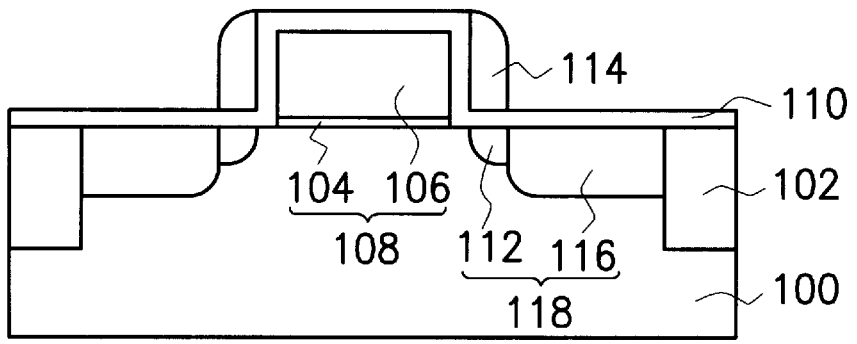

Continuing to FIG. 1B, an ion implantation is conducted to form a lightly doped source/drain region 112 at both sides of the gate structure 108 in the substrate 100. After this, a spacer 114, about 500 angstroms wide, is formed on the sidewall of the gate structure 108. The spacer 114, such as silicon oxide, is formed by conventional deposition and etching methods. Another ion implantation is conducted at both sides of the gate structure 108 to form a heavily doped source/drain region 116 in the substrate 100 using the spacer 114 as a mask. The lightly doped source/drain region 112 and the heavily doped source/drain region 116 together form the source/drain region 118.

Figure 1C:
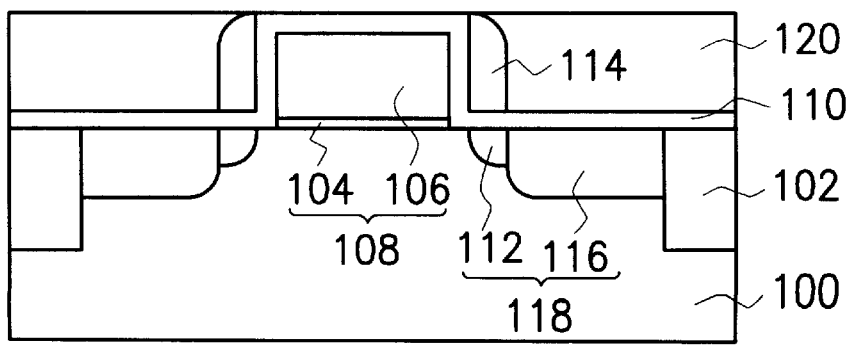

As shown in FIG. 1C, another sacrificial layer 120 is formed by, for example chemical vapor deposition, on the silicon substrate 100, covering the spacer 114 and the sacrificial layer 110. The sacrificial layer 120, such as silicon oxide is planarized by chemical mechanical polishing (CMP) until the sacrificial layer 110 on the top surface of the gate structure 108 is exposed.

Figure 1D:
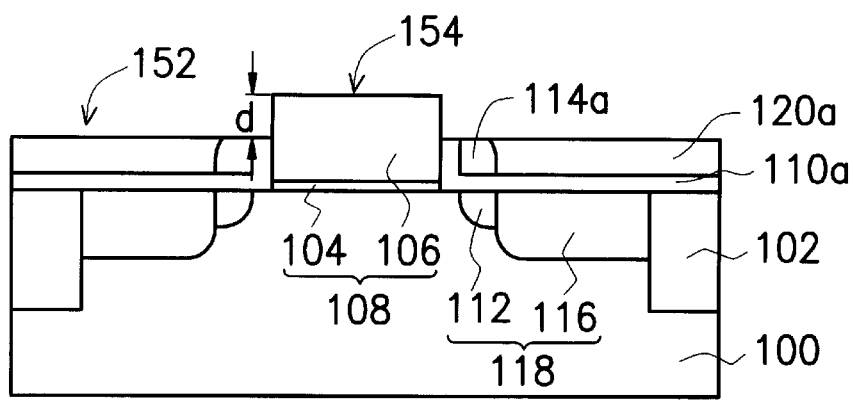

Referring to FIG. 1D, portions of the sacrificial layer 120, the spacer 114, the sacrificial layer 110 are removed until the surface 152 of the sacrificial layer 120 (FIG. 1C) is lower than the top surface 108 of the polysilicon gate 154 by a thickness of "d", which is about 1500 angstroms, to form the sacrificial layer 120a, the spacer 114a and the sacrificial layer 110a. If the sacrificial layer 120 (FIG. 1C) and the spacer 114 (FIG. 1C) are silicon oxide and the sacrificial layer 110 (FIG. 1C) is silicon nitride, a buffer oxide etchant (BOE) and phosphoric acid ($H_3PO_4$) are used to etch the sacrificial layer 120, the spacer 114, and the sacrificial layer 110, respectively, to the desired heights.

Figure 1E:
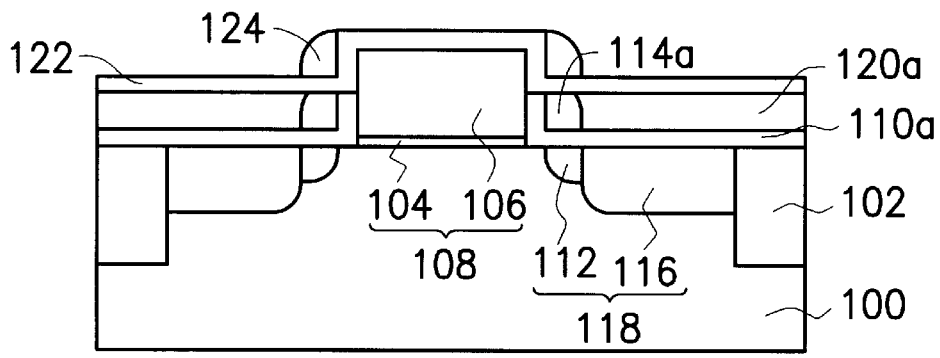

Referring to FIG. 1E, a conformal polysilicon layer 122 is then formed, covering the substrate 100, the spacer 114a, the sacrificial layer 120 and the gate 108. It is preferable that the polysilicon layer 122 is a doped polysilicon layer, and the polysilicon layer 122 is formed by, for example, chemical vapor deposition, and is about 300 to 500 angstroms thick. Another spacer 124 is then formed by the sidewall of the gate structure 108 on the polysilicon layer 122 above the spacer 114a. The spacer 124 such as silicon oxide, is formed by, for example, forming a silicon oxide layer on the silicon substrate, followed by back etching the spacer 124. The spacer 124 is about 300 angstroms to about 800 angstroms wide.

Figure 1F:
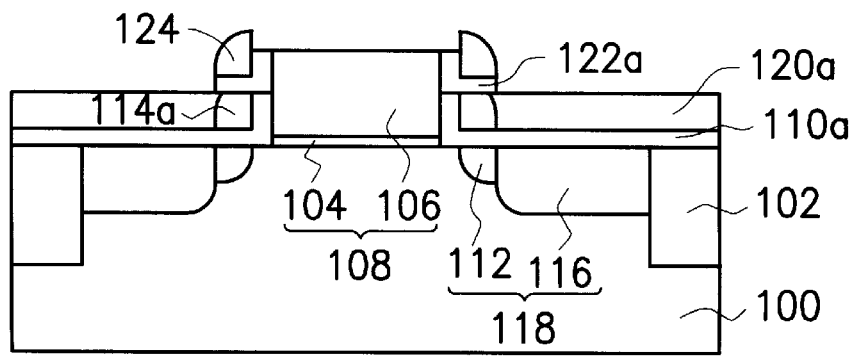

Referring to FIG. 1F, using the spacer 124 as a mask, the exposed polysilicon layer 122 is removed by, for example dry etching, to form a side-wing polysilicon layer 122a on both sides of the gate structure 108. With the formation of the side-wing polysilicon layer 122a on both sides of the gate structure 108, the gate contact area is increased. During the subsequent formation of a silicide, as a result, the narrow line effect is mitigated to effectively lower the gate contact resistance.

Figure 1G:
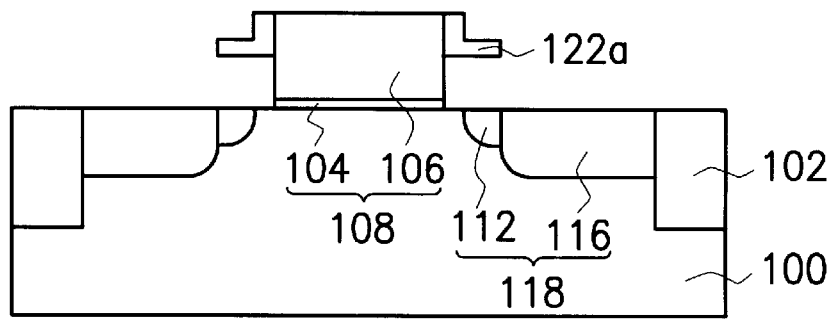

Continuing to FIG. 1G, the spacer 124 (FIG. 1F), the sacrificial layer 120a (FIG. 1F), the spacer 114a are removed using, for example, a buffer oxide etchant (BOE), followed by removing the sacrificial layer 110a with phosphoric acid ($H_3PO_4$).

Figure 1H:
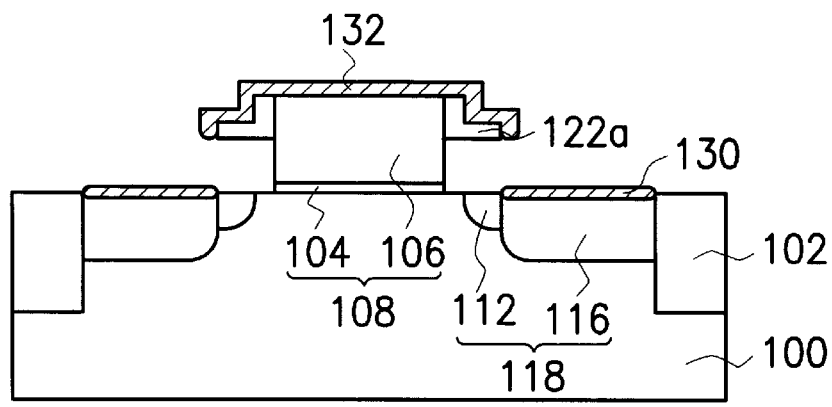

As shown in FIG. 1H, a silicidation process is conducted to form a silicide layer 132 on the top surface of the gate 108 and the side-wing polysilicon layer 122a, and to form a silicide layer 130 on the surface of the heavily doped source/drain region 116. The silicide layers 130 and 132 are, for example, titanium silicide or cobalt silicide. Using the titanium silicide as an example, the titanium silicide layers 130, 132 are formed by depositing silicon on the silicon substrate 100, covering the gate 108 and the surface of the heavily doped source/drain region 116. A rapid thermal process is conducted to form a titanium silicide layer only, in principle, where the titanium is in contact with silicon. A wet etching is further conducted to remove the unreacted metal. Another rapid thermal process is conducted to form the low resistance C54 phase titanium silicide.

Figure 1I:
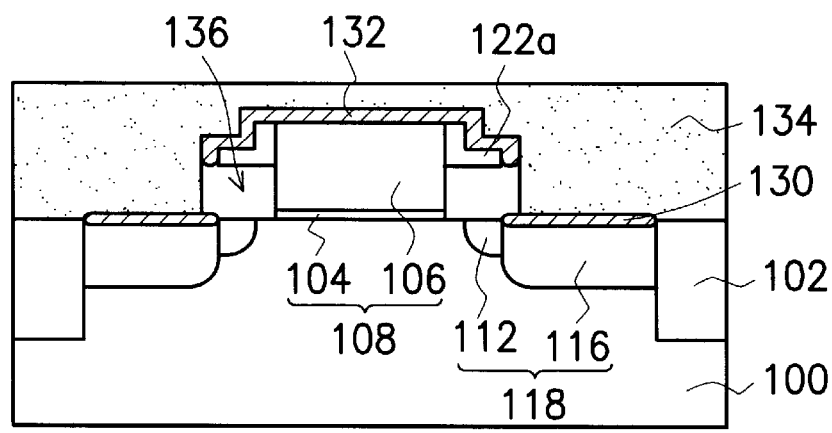

Referring to FIG. 1I, an insulation layer 134 is formed on the silicon substrate 100, covering the silicide layers 130 and 132. The insulation layer 134, such as sputtered oxide, is formed by reactive sputtering deposition. By using the anisotropic deposition characteristic of sputtering, an air spacer 136 is formed under the side-wing polysilicon layer 122a. Since the dielectric constant of air is very low, about 1, the formation of the air spacer 136 can lower the parasitic capacitance between the gate 108 and source/drain region to prevent the RC time delay.

Based on the preferred embodiment of the present invention, the present invention comprises at least the following advantages. The formation of the side-wing layer on both sides of the gate 108 increases the area of the gate 108 for silicidation. The narrow line effect is, therefore, prevented. Furthermore, an air spacer 136 is formed under the side-wing layer to lower the parasitic capacitance between the gate 108 and source/drain region 118.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method to increase the gate contact area, which is applicable on a silicon substrate comprising device isolation structures, the method comprising the steps of:

forming a polysilicon gate structure on the silicon substrate;

forming a first sacrificial layer on the silicon substrate and the gate structure;

forming a second sacrificial layer on the substrate, wherein a surface of the second sacrificial layer is lower than a top of the polysilicon gate by a certain thickness;

removing an exposed first sacrificial layer;

forming a conformal polysilicon layer on the substrate;

forming a spacer on a sidewall of the gate structure;

removing an exposed polysilicon layer to form a side-wing polysilicon layer on the side of the gate; and removing the spacer, the second sacrificial layer and the first sacrificial layer.

2. The method to increase the gate contact area according to claim 1, wherein the first sacrificial layer includes a silicon nitride layer.

3. The method to increase the gate contact area according to claim 1, wherein the second sacrificial layer includes forming a silicon oxide layer.

4. The method to increase the gate contact area according to claim 1, wherein the surface of the second sacrificial layer is lower than the top of the polysilicon layer by about 1500 angstroms.

5. The method to increase the gate contact area according to claim 1, wherein the polysilicon layer is formed by chemical vapor deposition.

6. The method to increase the gate contact area according to claim 1, wherein the exposed polysilicon layer is removed by dry etching.

7. The method to increase the gate contact area according to claim 6, wherein the sidewall serves as a mask in the step of removing the exposed polysilicon layer.

8. A fabrication method for a gate contact conductive structure, which is applicable to a silicon substrate comprising device isolation structures and a polysilicon gate, the method comprising the steps of:

forming a conformal sacrificial layer on a silicon substrate, wherein the conformal sacrificial layer covers the gate and the device isolation structures;

forming a second sacrificial layer on the silicon substrate, wherein a surface of the second sacrificial layer is lower than a top of the polysilicon gate by a thickness;

removing an exposed first sacrificial layer;

forming a conformal polysilicon layer on the silicon substrate, wherein the conformal polysilicon covers the gate and the second sacrificial layer;

forming a spacer on a sidewall of the gate structure;

removing the exposed polysilicon layer to form a side-wing polysilicon layer on both sides of the gate;

removing the spacer, the second sacrificial layer and the first sacrificial layer; and conducting a silicidation process to form a silicide layer on the polysilicon gate and the side-wing polysilicon layers.

9. The fabrication method for a gate contact conductive structure according to claim 8, wherein the first sacrificial layer includes a silicon nitride layer.

10. The fabrication method for a gate contact conductive structure according to claim 8, wherein the second sacrificial layer includes a silicon oxide layer.

11. The fabrication method for a gate contact conductive structure according to claim 8, wherein the surface of the second sacrificial layer is lower than the top of the polysilicon layer by about 1500 angstroms.

12. The fabrication method for a gate contact conductive structure according to claim 8, wherein the spacer includes silicon oxide.

13. The fabrication method for a gate contact conductive structure according to claim 8, wherein the silicide layer includes a titanium silicide layer.

14. The fabrication method for a gate contact conductive structure according to claim 8, wherein the silicide layer includes a cobalt silicide layer.

15. The fabrication method for a gate contact conductive structure according to claim 13, wherein the formation of the silicide layer includes:

forming a metal layer on the polysilicon layer and on the side-wing polysilicon layers; and conducting a thermal process to induce a reaction between the metal layer and silicon.

16. The fabrication method for a gate contact conductive structure according to claim 8, wherein an etchant used to remove the spacer and the second sacrificial layer is different from that of the first sacrificial layer.

17. A fabrication method for a semiconductor device including the step of:

providing a silicon substrate, wherein the substrate comprises a device isolation structure;

forming a polysilicon gate structure on the substrate;

forming a conformal first sacrificial layer on the silicon substrate and on the gate structure;

conducting an ion implantation to form a lightly doped source/drain region at both sides of the gate in the substrate;

forming a first spacer on a sidewall of the gate structure;

conducting an ion implantation to form a heavily doped source/drain region at both sides of the gate in the substrate next to the lightly doped source/drain region;

forming a second sacrificial layer on the silicon substrate, wherein the second sacrificial layer covers the first spacer and the first sacrificial layer;

removing a portion of the second sacrificial layer, the first spacer and the first sacrificial layer until a surface of the second sacrificial layer is lower than a top of the polysilicon gate by a certain thickness;

forming a conformal polysilicon layer to cover the silicon substrate;

forming a second spacer on the sidewall of the gate structure;

removing an exposed polysilicon layer to form a side-wing polysilicon layer on both sides of the gate;

removing the second spacer, the second sacrificial layer, the first spacer and the first sacrificial layer;

conducting a silicidation process to form a silicide layer on the polysilicon gate and on a surface of the heavily doped source/drain region; and forming an insulation layer on the silicon substrate to form an air spacer under the side-wing polysilicon layer.

18. The fabrication method for a semiconductor device according to claim 17, wherein the first sacrificial layer includes a silicon nitride layer.

19. The fabrication method for a semiconductor device according to claim 17, wherein the first sacrificial layer is about 200 angstroms thick.

20. The fabrication method for a semiconductor device according to claim 17, wherein the first spacer includes a silicon oxide layer.

21. The fabrication method for a semiconductor device according to claim 17, herein the second sacrificial layer includes a silicon oxide layer.

22. The fabrication method for a semiconductor device according to claim 17, wherein the surface of the second sacrificial layer is lower than the top of the polysilicon layer by about 1500 angstroms.

23. The fabrication method for a semiconductor device according to claim 17, wherein the polysilicon layer is about 300 angstroms to about 500 angstroms thick.

24. The fabrication method for a semiconductor device according to claim 17, wherein the second spacer is silicon oxide.

25. The fabrication method for a semiconductor device according to claim 17, wherein the second spacer is about 300 angstroms to about 800 angstroms thick.

26. The fabrication method for a semiconductor device according to claim 17, wherein the silicide layer includes titanium silicide.

27. The fabrication method for a semiconductor device according to claim 17, wherein the silicide layer includes cobalt silicide.

28. The fabrication method for a semiconductor device according to claim 17, wherein the exposed polysilicon layer is removed by dry etching.

29. The fabrication method for a semiconductor device according to claim 28, wherein the second spacer serves as a mask during the removal of the exposed polysilicon layer.

30. The fabrication method for a semiconductor device according to claim 17, wherein the second spacer, the second sacrificial layer, the first spacer and the first sacrificial layer are removed by wet etching, and an etchant for removing the second spacer, the second sacrificial layer and the first spacer is different from that for removing the first sacrificial layer.

* * * * *